United States Patent [19]
Schepers et al.

[11] Patent Number: 4,965,557
[45] Date of Patent: Oct. 23, 1990

[54] INTERACTIVE CONTROL OF ENTERTAINMENT ELECTRONICS APPARATUS

[75] Inventors: Charles Schepers, Karlsruhe-Hagsfeld; Wolfgang Schröder, Pforzheim, both of Fed. Rep. of Germany

[73] Assignee: Nokia Unterhaltungselektronik, Pforzheim, Fed. Rep. of Germany

[21] Appl. No.: 339,942

[22] Filed: Apr. 17, 1989

Related U.S. Application Data

[63] Continuation of Ser. No. 172,931, Mar. 18, 1988, abandoned, which is a continuation of Ser. No. 49,389, May 13, 1987, abandoned, which is a continuation of Ser. No. 518,241, Jul. 28, 1983, abandoned.

[30] Foreign Application Priority Data

Jul. 29, 1982 [DE] Fed. Rep. of Germany ....... 3228354

[51] Int. Cl.$^5$ ............................................. G09G 1/00
[52] U.S. Cl. ..................................... 340/711; 341/23; 358/194.1
[58] Field of Search ............... 340/711, 712, 706, 707, 340/721, 825.69, 825.72; 358/22, 183, 194.1, 188; 455/603; 341/23

[56] References Cited

U.S. PATENT DOCUMENTS

| | | | |
|---|---|---|---|
| 3,648,270 | 3/1972 | Metz et al. | 340/711 |
| 4,099,246 | 7/1978 | Osborne et al. | 340/365 R |
| 4,185,282 | 1/1980 | Pick | 340/711 |
| 4,270,145 | 5/1981 | Farina | 358/188 |
| 4,278,993 | 7/1981 | Suzuki | 358/183 |
| 4,337,480 | 6/1982 | Bourassin et al. | 358/183 |
| 4,344,090 | 8/1982 | Belisomi et al. | 358/22 |
| 4,386,436 | 5/1983 | Kocher et al. | 358/194.1 |
| 4,430,728 | 2/1984 | Beitel et al. | 340/825.34 |
| 4,477,797 | 10/1984 | Nakagiri | 340/712 |
| 4,482,947 | 11/1984 | Zato et al. | 358/194.1 |
| 4,488,179 | 12/1984 | Krüger et al. | 340/706 |
| 4,495,654 | 1/1985 | Deiss | 358/194.1 |
| 4,533,952 | 8/1985 | Norman, III | 358/22 |

FOREIGN PATENT DOCUMENTS

| | | |
|---|---|---|
| 00684220 | 1/1983 | European Pat. Off. . |
| 3028223 | 2/1982 | Fed. Rep. of Germany . |
| 3104843 | 8/1982 | Fed. Rep. of Germany . |
| 3210893 | 10/1983 | Fed. Rep. of Germany . |
| 0054523 | 4/1979 | Japan ................................ 358/22 |
| 2033692 | 5/1980 | United Kingdom ............. 358/22 |

OTHER PUBLICATIONS

"Ultraschall-Fernbedienungen fur Farbfernsehempfanger", Funk-Tehnik, 30 Jahrgang, Nr. 14/1975.
"Farbempfanger mit einfacher Vorprogrammierung", K. Knuth, Funkschau, 1978, Heft 9.
"A Programmable TV Receiver", N. Kokado et al., IEEE Transactions on Consumer Electronics, vol. 22, No. 7, Feb. 1976.
"Microprocessor Based, Software Defined Television Controller", C. Clifford et al., IEEE Transactions on Consumer Electronics, vol. CE-24, No. 3, Aug. 1978.

Primary Examiner—Alvin Oberley
Assistant Examiner—M. Fatahiyar
Attorney, Agent, or Firm—Peter C. Van Der Sluys

[57] ABSTRACT

The application describes how the control of entertainment electronics apparatus or combinations thereof can be simplified to the point that even an unpracticed user can make all necessary or desired adjustments as easily as possible. Even in a large combination, all functions can be controlled from a single control unit. The control unit has only a limited number of clearly arranged, distinct control elements.

23 Claims, 2 Drawing Sheets

INTERACTIVE CONTROL OF ENTERTAINMENT ELECTRONICS APPARATUS

This application is a continuation of application Ser. No. 07/172,931, filed Mar. 18, 1988, now abandoned, which is a continuation of application Ser. No. 07/049,389, filed May 13, 87, now abandoned, which is a continuation of application Ser. No. 06/518,241, filed July 28, 1983 now abandoned.

The present invention relates to entertainment electronics apparatus with different modes and a control unit for selecting or setting the different modes, comprising a display and/or a screen and a character generator for presentation on the display and/or on-screen display of the respective mode (e.g. channel number) or another variable quantity (e.g., time).

In entertainment electronics apparatus, the steady progress of technology not only leads to continuous improvements in the apparatus but also offers the user an increasing number of possibilities. In television, for example, a second sound channel makes it possible to transmit either stereo sound or two separate sound channels, in which case a choice can preferably be made between accompanying texts in two different languages. Also known are add-on units for teletext, videotex, or video games. Thus, it is necessary, or it must be possible, to perform an increasing number of additional adjustments. At the same time, the user demands simplicity of operation, particularly remote-control capability. The manufacturer, too, attaches importance to straightforward operation in order to reach additional circles of customers. A remote-control unit should be designed so that it can be conveniently held in one hand and operated with the other hand or even with the holding hand. There are ways to remotely control a set or a combination of sets with many control functions:

Only the most important functions (e.g., ON/OFF, volume, brightness, station selection) are made remotely controllable, while the remainder,(e.g., color saturation, treble and bass, balance) are adjustable only on the set.

All components of a system (e.g., television receiver, video recorder, possibly separate hi-fi stereo sound unit) are controlled with separate remote-control units.

Remote-control units are used which have one control element, preferably a key, for each function. In this case, the keys must be rather small and spaced quite closely. Combining the keys in groups requires additional space between the individual groups. The marking would have to be rather small and, thus, practically illegible, particularly in view of the fact that such units are frequently used in semidarkness.

A control unit is used on which only a limited number of distinct keys is arranged. Part of the keys can then be used to initiate different functions, the selection from the different functions assigned to a key being made by previously operating other keys. These keys must then bear two or more markings, which thus become small and illegible again, or only the respective basic function is marked, while the respective additional functions must be looked up or learned by heart.

A user adjustment is acknowledged by displays on the screen of a television set or on any other display so as to call the user's attention to maladjustments.

In all these cases, however, a user, particularly one not familiar with the apparatus or the system configuration, will be unable or hardly able to carry out all desired adjustments without special effort. At best, his or her attention will be immediately called to a faulty operation.

In the audio field, too, the components or combinations of components (e.g., amplifier, tuner, cassette recorder, record player) have so many control functions that the size of the equipment is frequently determined by the control elements. In the case of such equipment, too, remote control should be possible.

The object of the invention is to simplify the control of entertainment electronics apparatus or combinations thereof to the point that even an unpracticed user can perform all necessary or desired adjustments as easily as possible. Even in the case of a large system, all functions are to be controllable from a single control unit. The control unit is to have only a limited number of distinct control elements; there is to be no need to provide individual control elements with two or more markings.

According to the invention, this object is attained by the characterizing features of claim 1. Preferred embodiments of the invention are set forth in the subclaims.

BRIEF DESCRIPTION OF THE DRAWINGS

An embodiment of the invention will now be explained in more detail with reference to the accompanying drawings, in which.

DESCRIPTION OF THE PREFERRED EMBODIMENTS

Figure 1:
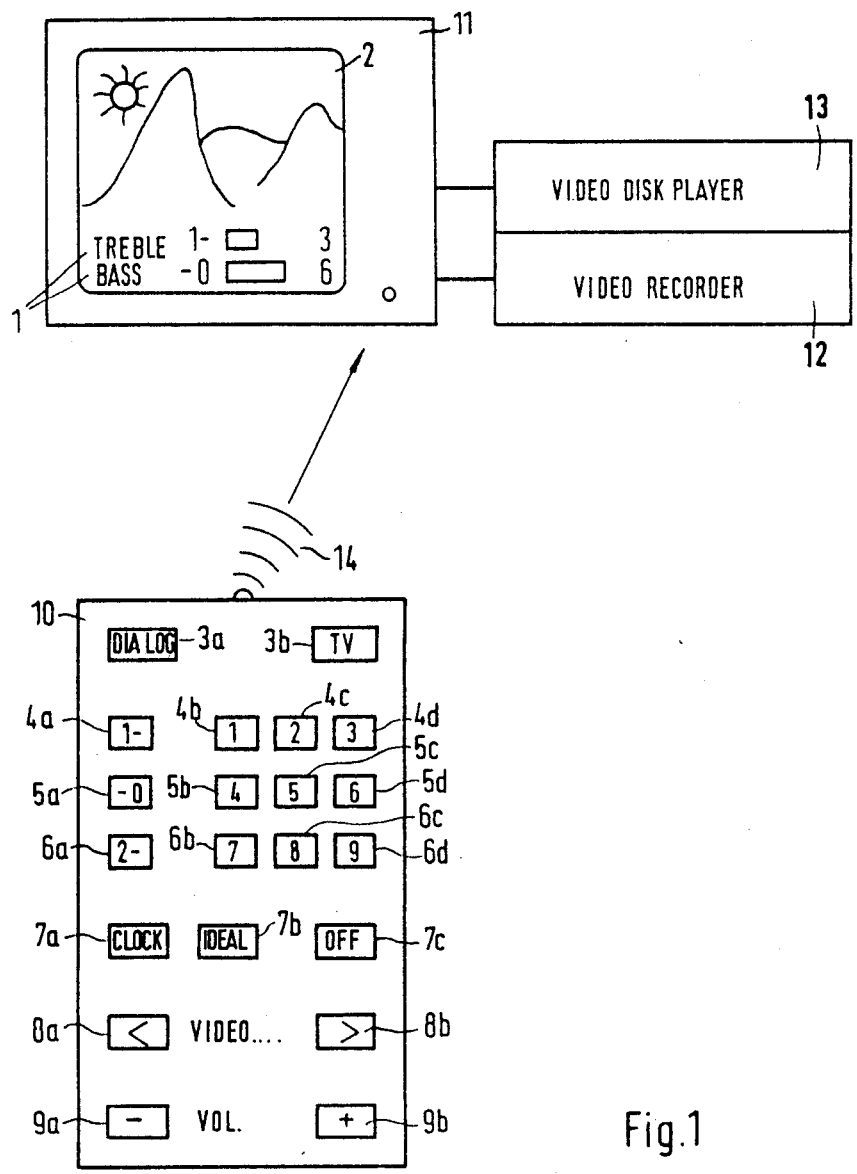
FIG. 1 shows an arrangement in accordance with the invention consisting of a television receiver with a remote-control unit and with two further entertainment electronics components which are connected to the television receiver and controllable via the receiver's remote control unit.

FIG. 1 shows a television receiver 11 with a screen 2 and a separate remote-control unit 10. The link 14 between the remote-control unit 10 and the television receiver 11 is indicated by symbolic waves. Whether this link 14 uses waves (e.g., ultrasound, infrared waves) or any other means is immaterial for the invention. The control unit 10 can also be simplified by the invention if the control unit is built into or removable from the television receiver 11.

Information 1 is superimposed on the picture shown on the screen 2 of the television receiver 11. It consists partly of letters and partly of simple graphics (here: bar charts), which have distinctive colors. Especially important parts are called to the user's attention by being caused to blink.

Connected to the television receiver 11 are two additional components, a video recorder 12 and a video disk player 13. The connections include control lines over which the connected components can be remotely controlled from the television receiver and, thus, from the receiver's remote control unit. The connected components 12, 13 may also signal information on their current status (e.g., end of tape, fast forward) to the television receiver for on-screen display 1.

The remote control unit 10 has a number of keys 3 to 9, with which the television receiver 11 and the connected components 12, 13 can be controlled. With the keys 4 to 6, up to 29 television programs can be selected. By successively depressing the keys 4a and 5b, for example, the television program "14" is selected. It is already common practice to display a selection just made on the screen or on a separate display for at least a few seconds. In the present case, the number 14 would be displayed in the top right-hand corner of the television picture, or, in more detail, the text "program 14, channel 34" would be displayed in the lower portion of the picture. At the same time, the television receiver 11 is turned on if necessary. Depressing the keys 9a and 9b varies the volume. As a rule, no further adjustments are necessary for the television viewer.

Operation of key 7a initiates a brief on-screen display of the time of day. Depression of key 7c turns the entire system off. It goes to a standby mode and can be reactivated only by selecting a program. Further adjustments can be made on the activated set by depressing the group selection key 3a.

By depressing the group selection key 3a, the first page of a text memory incorporated in the television receiver 11 is called up, and its contents are superimposed on the screen. For example, the words "contrast", "color level", and "brightness" appear one below the other. The word "contrast" is then followed by the markings of the keys with which contrast can be reduced and increased, respectively. In this example, these are the markings of the keys 4a and 4d, i.e., operation of key 4a results in a contrast reduction, while operation of key 4d results in a contrast enhancement. Between the two on-screen displays of the markings of the keys 4a and 4d, the contrast setting is shown in the form of a bar. Correspondingly, operation of keys 5a and 5d adjusts the color level, and operation of keys 6a and 6d adjusts brightness. Such adjustments can be cancelled at any time by operating key 7b.

By operating key 7b, all analog adjustments made from the remote-control unit 10 are rendered ineffective. This brings those adjustments into effect which were preset by means of potentiometers, trimmers, or otherwise and should correspond to the ideal condition.

The keys 4b, 4c, 5b, 5c, 6b, 6c are not used for analog adjustments. They may be used for switching operations, to which the user's attention may be called by on-screen displays of predetermined texts. For example, the text "Videotext=1, video recorder=4" signifies that operation of key 4b, marked "1", switches the receiver to the "Videotext" (teletext) mode, and operation of key 5b, marked "4", puts the video recorder into operation.

Both on a change to another mode or another component and on a second operation of the group selection key 3a, the adjusting process supported by the on-screen displays, which is possible only during these displays, is considered finished. A new page of the text memory is displayed, and at the same time, the keys 4 to 6 are switched to other functions.

Depression of the group selection key 3a causes the next text page to be displayed. If, for example, the first text page contained all functions which influence the picture of the television receiver, the second text page will contain the functions influencing the sound of the television receiver. These may be treble, bass, balance, and switchover to sound channel 1, sound channel 2, or stereo. Simultaneously with the display of the second text page, the functions of the keys 4 to 6 are switched over. The other keys, including the volume keys 9a, 9b, always have the same functions.

Each text page contains information on a group of control functions belonging together and on the respective keys to be operated to initiate these functions. Two or more related groups of control functions are combined in packets of successive text pages. Such a packet consists, for example, of all text pages with the aid of which a connected video recorder is programmed for recording. A further packet may relate to reproduction from the video recorder.

The change from one text page to another may occur in various ways:

By operating the group selection key 3a, changeover to the next text page is effected.

After lapse of a predetermined period of time from the last key operation, automatic changeover to the next text page takes place.

With each text page, a selection of further text pages is given which can be selected by operating a specified key. As a rule, this page will be the first page of a packet.

A given page may also be selected directly by depressing the group selection key 3a and then entering a page number via the keys 4 to 6 if the page number is known.

By depressing an termination key 3b, changeover is effected either to the normal condition or to the first page of a following packet, depending on the particular design.

After operation of the termination key 3b, a number may be entered via the keys 4 to 6 to either switch back to the normal condition or to the beginning of a selected packet.

From the last page of a complete packet, a change back to the normal condition takes place. The display of the first text page of the next packet can be initiated only by depressing either the group selection key 3a or the termination key 3b, not by the lapse of a predetermined period of time.

The individual text page is constructed so as to give the user as much operating assistance as possible.

Not only are related functions contained on one text page or on successive text pages, but as large a portion of the picture as possible remains visible to permit a check on the adjustment made. Advantageously, the text page is graphically organized in such a way, e.g., in the form of a table showing the arrangement of the keys on the control unit, that the user not only can readily see which key to depress in order to initiate a given function, but also will find this key on his or her remote control unit as quickly as possible. The use of different colors also makes it easier to distinguish the keys from each other.

A text page specifies only how to perform a given adjustment. Simultaneously with the on-screen display of text pages, the result of an adjustment may be displayed in a manner known per se. This includes frequency or channel numbers, but also analog quantities, such as treble and bass, which can be displayed on the screen in graphic representations, particularly bar representations, simultaneously with the text page.

Particularly those switching functions with which switchover is effected to other modes (e.g., the Videotext mode) or other component combinations (e.g., to record reproduction) should be switchable neither from all text pages nor from only one text page. The information on such switching functions and, thus, on the switching of the corresponding keys comes from two or more text pages.

Functions required for ordinary television reception, such as program selection, must not be adjustable only after selection of a given text page. These functions must be adjustable already in the normal condition, i.e., before the associated keys are switched to another function by selecting a text page. Especially important functions must be adjustable at any time, no matter whether a given text page has just been selected or not. Such functions must be assigned to keys which are not switchable to other functions. This applies above all to volume (keys 9a, 9b) and to switchover to standby (key 7c). Fast forward and rewind of connected tape recorders, too, are controlled via keys (8a, 8b) whose function is not changed by the selection of text pages.

Not all functions should be controllable by any user. For example, a video tape inserted in a video recorder connected to the television receiver must not be erased by anybody. A tape can be erased only if a special blocking code was previously keyed in via the digit keys 4 to 6, which otherwise serve for channel selection. Of course, an on-screen display calls the user's attention to the fact that a blocking code must be entered, but not which one. For different control functions to be protected, either the same blocking code or a different blocking code is used. Before the respective function is initiated, a blocking code entered by the user is checked with the aid of a code stored in the set. This code is predetermined either by the manufacturer or by the user himself. For blocking codes to be predetermined by the user, the set contains electrically programmable and erasable nonvolatile memories. In another embodiment, the code for blocking the erasure of a tape is entered by the user prior to the recording process and stored at the beginning of the tape. Prior to each use of the tape, this code is transferred into a read/write memory in the set. When the set expects a blocking code to be entered, the following entry, unlike all other entries, will not be superimposed on the screen for checking purposes.

Sets are known in which digital circuitry is used for signal processing. To make adjustments in such sets, coefficients preset as numerical values in digital form must be varied. According to the invention, after entry of a blocking code, adjusting information is superimposed on the screen. New coefficients are then entered, and adjustments are made, through the remote control unit.

Figure 2:
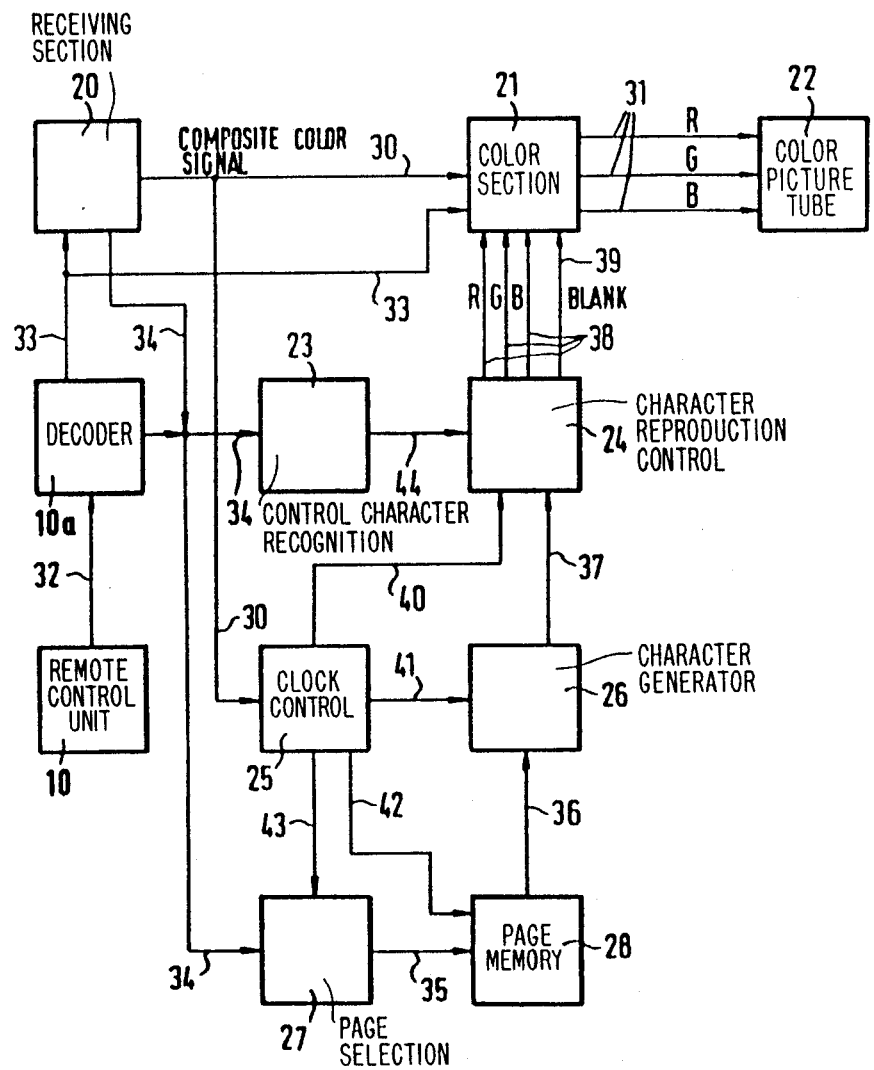
FIG. 2 is a block diagram of a television receiver in accordance with the invention.

FIG. 2 shows the design of and the signal flow in the television receiver 11 of FIG. 1. A receiving section 20 forms a video signal (composite color signal) 30. In a color section 21, the video signal 30 is split up into three color signals 31 with which a color-picture tube 22 is driven. The control instructions 32 coming from the remote control unit 10 are converted into control characters 33 in a decoder 10a associated with the remote control unit 10. By these control characters 33, the necessary adjustments are initiated both in the receiving section 20 and in the color section 21. The decoder 10a also generates display control characters 34 with which the on-screen displays 1 are controlled.

In a page selection circuit 27, the display control characters select a page whose address is sent over an address bus 35 to a page memory 28. The contents of the selected page are transferred, character by character and in coded form, to a character generator 26 over a data bus 36. The character generator resolves the characters into individual elements again. In the present case of a television receiver, these elements are dots from a 7-by-10 matrix. The elements are transferred over a character reproduction bus 37 to a character reproduction control circuit 24. The latter forms color signals (R, G, B) 38 and a blanking signal (Blank) 39 which are evaluated in the color section 21. The blanking signal 39 switches between reproduction of the color corresponding to the color information of the video signal 30 and reproduction of the color determined by the color signal 38. In this manner, the normal television picture is blanked and the text of the page is displayed.

A clock control circuit 25 is synchronized by the video signal 30. It generates a window clock 40, which enables the reproduction control circuit 24 for a display in the lower portion of the picture. By a reproduction clock 41, the clock control circuit 25 regulates the sequence of elements in the character generator 26. A line clock 42 generated in the clock control circuit 25 calls up the display text from the page memory 28 line by line. The page selection circuit 27 is fed with an auxiliary clock 43 from the clock control circuit 25.

The display control characters 34 are also evaluated in a control character recognition circuit 23. The control character recognition circuit 23 sends instructions to the reproduction control circuit 24 over a reproduction control bus 44.

The control character recognition circuit 23 determines the color of the characters to be displayed and, possibly, the background in the immediate vicinity of these characters; if necessary, it causes the display to blink and additional information to be displayed. Such additional information is, in particular, information on the current mode of operation. The user operations are acknowledged, the values of quantities to be adjusted or just set by the user are displayed in a bar representation, and information on the program being received (e.g., stereo broadcast) is shown. In this case, the display control characters 34 necessary therefor are generated not by the decoder 10a but by the receiving section 20.

In a further embodiment, a read/write memory is interposed between the page memory 28 and the character generator 26. This permits slower and, thus, low-loss memories to be used in the page memory 28, which is a read-only memory.

In television receivers equipped for teletext ("Videotext") and/or videotex ("Bildschirmtext", "Viewdata") reproduction, the teletext and/or videotex generator is utilized for the display of pages with control instructions. It needs to be supplemented essentially only with the page selection circuit 27 and the page memory 28.

The on-screen display of predetermined texts as control instructions is not limited to television receivers or other equipment with display screens. Many other entertainment electronics components are equipped with displays with the aid of which the user can check the control instructions entered by him or her. This includes frequency displays from which the frequency setting can be read. In the case of programmable recorders, the set times are displayed. According to the invention, such a display is used not only to check the control operation afterwards, but to support it in advance by giving brief instructions. In that case, the individual page will be shorter and usually contain only a single control instruction.

If two or more entertainment electronics components are interconnected, the same control instructions will be simultaneously presented on all displays of these components. These displays are initiated from only one component, which then acts as the center of the system.

If each of the interconnected components is capable of delivering instruction texts, one of them will be selected to act as a center. This selection can be changed by the user. By operating keys shown on the display, another component is caused to become the center.

We claim:

1. An improved entertainment electronics apparatus having a plurality of control functions, related ones of said control functions being grouped together in control groups, said apparatus comprising:

control means having a plurality of settable function keys and a control group selection key for selecting one of a plurality of different control groups, said settable function keys each being set in response to the selection of a control group for control of the control functions of the selected control group, a control group being selected by operation of at least one of a group of keys, including a settable function key, of the selected control group, that is set for allowing selection of another control group and the control group selection key;

display means;

character generator means, connected to said display means and in communication with said control means, for generating signals for said display means to display information relating to the selected one of said different control groups;

test memory means, connected to said character generating means and in communication with said control means, for storing a plurality of predetermined texts which correspond to and convey information relating to each respective one of said plurality of different control groups; and call-up means for calling up a text corresponding to the selected control group from said memory means for presentation by said display means, said call-up means including means for selecting another text in response to the selection of another control group, whereby interactive control of the entertainment electronics apparatus is provided by displaying a text explaining the control functions of the settable function keys for each selected control group and by providing for the selection of another control group using the settable function keys.

2. The apparatus as defined in claim 1, wherein the control means is a remote-control device physically separated from the apparatus but in communication therewith.

3. The apparatus as defined in claim 1, wherein the apparatus is operable in different modes, and an operating mode is selected by operation of one of said group of keys.

4. The apparatus as defined in claim 1, additionally comprising a plurality of fixed function keys for controlling selected functions.

5. The apparatus as defined in claim 1, wherein the settable function keys are each assigned a basic control function of a basic control group and include indicia identifying the basic control function, said basic control functions not having a corresponding text stored in the memory means.

6. The apparatus as defined in claim 5, additionally comprising a plurality of fixed function keys for controlling selected functions.

7. The apparatus as defined in claim 5, wherein the apparatus is operable in different modes, and an operating mode is selected by operation of one of said group of keys, one of said operating modes being a basic default operating mode requiring the basic control functions of the basic control group.

8. The apparatus as defined in claim 7, wherein the apparatus includes means for automatically selecting the basic default operating mode when another operating mode or a control group is not selected, by operation of keys of said control means.

9. The apparatus as defined in claim 1, wherein at least one peripheral electronics apparatus is coupled to said apparatus, said control means includes means for controlling said peripheral apparatus, said text memory means includes a plurality of corresponding texts which each correspond to control groups for said peripheral apparatus, said call-up means causing said display means to display a corresponding one of said plurality of said corresponding texts on said display when said control groups for said peripheral apparatus are selected by operation of at least one of said group of keys.

10. The apparatus as defined in claim 1, wherein said apparatus includes timing means for automatically switching from one control group to a second control group after passage of a predetermined period of time.

11. The apparatus as defined in claim 1, wherein said apparatus includes means for switching from one control group to a second control group by the actuation of said control group selection key and at least one of said settable function keys.

12. The apparatus as defined in claim 5, wherein a plurality of said control groups are combined in a packet, and said apparatus additionally comprises means for switching to each of said control groups in each said packet one after another automatically or in response to actuating one of said groups of keys.

13. The apparatus as defined in claim 12, additionally including means for switching back to said basic control groups after switching to each of said control groups in a packet.

14. Apparatus as defined in claim 13, additionally comprising at least one termination key including means actuable by said termination key to switch back to said basic control group.

15. The apparatus as defined in claim 14, including at least a second packet of control groups wherein actuation of said termination key switches to a first one of said second packet control groups.

16. The apparatus as defined in claim 15, wherein actuation of said termination key is combined with actuation of one or more of said settable function keys to switch to said basic control group or to a selected one of said packets of control groups.

17. The apparatus as defined in claim 1, including means for indicating analog control functions as graphic bar representations on said display.

18. The apparatus as defined in claim 1, wherein at least the control functions in effect for said settable function keys is arranged in a table on said display corresponding to the physical arrangement of said settable function keys on said control means.

19. The apparatus as defined in claim 1, wherein said control means includes means for blocking the selection of a text until entry of a predetermined and not displayed blocking code.

20. The apparatus as defined in claim 19, including means for programming said blocking code into said callup means for calling up said texts.

21. The apparatus as defined in claim 20 including electrically programmable and erasable nonvolatile memory means for storing said blocking code.

22. The apparatus as defined in claim 19 wherein entry of said blocking code is not presented on said display.

23. The apparatus as defined in claim 1, further including a plurality of module means, including character reproduction control means for reproducing characters on a portion of the display while suppressing the normal information, control character recognition means for recognizing the actuation of one of said group of keys and controlling said character reproduction control means in response thereto, character generating means for generating character elements and coupling them to said character reproduction control means, page memory means for storing a plurality of control groups, page selection means for selecting one of said control groups, clock control means for controlling the timing of said text memory means and decoding means for generating control characters in response to actuation of one of said group of keys.

* * * * *